(12) United States Patent
Busch et al.

(10) Patent No.: US 11,216,723 B2
(45) Date of Patent: Jan. 4, 2022

(54) PULSE-WIDTH MODULATED MULTIPLIER

(71) Applicant: Syntiant, Aliso Viejo, CA (US)

(72) Inventors: Kurt F. Busch, Laguna Hills, CA (US); Jeremiah H. Holleman, III, Irvine, CA (US); Pieter Vorenkamp, Laguna Beach, CA (US); Stephen W. Bailey, Irvine, CA (US)

(73) Assignee: SYNTIANT, Aliso Viejo, CA (US)

( * ) Notice: Subject to any disclaimer, the term of this patent is extended or adjusted under 35 U.S.C. 154(b) by 756 days.

(21) Appl. No.: 16/101,280

(22) Filed: Aug. 10, 2018

(65) Prior Publication Data

US 2019/0050721 A1 Feb. 14, 2019

Related U.S. Application Data

(60) Provisional application No. 62/544,574, filed on Aug. 11, 2017.

(51) Int. Cl.
*G06N 3/063* (2006.01)
*G06N 3/10* (2006.01)
*G06N 3/04* (2006.01)
*G06N 3/08* (2006.01)

(52) U.S. Cl.
CPC ............ *G06N 3/0635* (2013.01); *G06N 3/049* (2013.01); *G06N 3/08* (2013.01); *G06N 3/105* (2013.01)

(58) Field of Classification Search
CPC ...... G06F 7/4876; G06G 7/161; G06N 3/049; G06N 3/0645; G06N 3/0635
See application file for complete search history.

(56) References Cited

U.S. PATENT DOCUMENTS

| | | | |
|---|---|---|---|
| 5,093,628 A | 3/1992 | Chan | |
| 5,256,911 A * | 10/1993 | Holler | G06N 3/0635 706/37 |
| 5,298,796 A | 3/1994 | Tawel | |
| 6,946,894 B2 * | 9/2005 | Shi | G06N 3/0635 327/356 |
| 8,466,725 B2 | 6/2013 | Thibault | |
| 2014/0285258 A1 | 9/2014 | Du et al. | |
| 2015/0303800 A1 | 10/2015 | Childs et al. | |
| 2017/0200078 A1 | 7/2017 | Bichler | |

OTHER PUBLICATIONS

PCT Search Report, PCT/US18/46395, dated Oct. 26, 2018.

\* cited by examiner

*Primary Examiner* — Benjamin P Geib
(74) *Attorney, Agent, or Firm* — Ravi Mohan; Rutan & Tucker, LLP

(57) ABSTRACT

Disclosed herein is a neuromorphic integrated circuit, including in many embodiments, a neural network disposed in a multiplier array in a memory sector of the integrated circuit, and a plurality of multipliers of the multiplier array, a multiplier thereof including at least one transistor-based cell configured to store a synaptic weight of the neural network, an input configured to accept digital input pulses for the multiplier, an output configured to provide digital output pulses of the multiplier, and a charge integrator, where the charge integrator is configured to integrate a current associated with an input pulse of the input pulses over an input pulse width thereof, and where the multiplier is configured to provide an output pulse of the output pulses with an output pulse width proportional to the input pulse width.

14 Claims, 4 Drawing Sheets

PULSE-WIDTH MODULATED MULTIPLIER

PRIORITY

Figure 1:
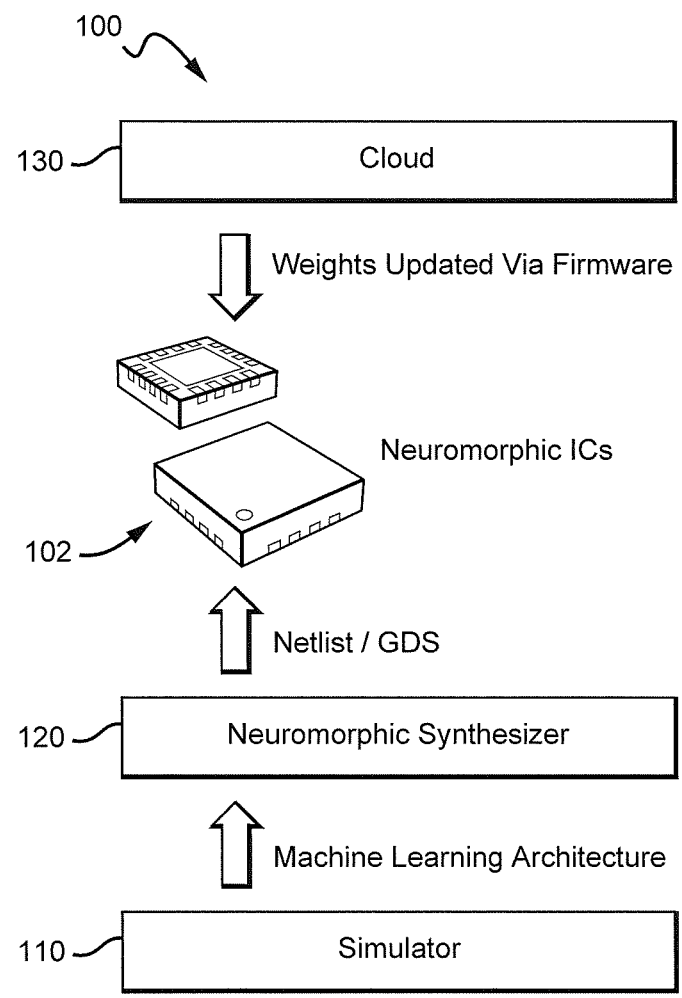

This application claims the benefit of priority to U.S. Provisional Patent Application No. 62/544,574, filed August, 2017, titled "Pulse-Width Modulated Multiplier," which is hereby incorporated by reference into this application in its entirety.

FIELD

Embodiments of the disclosure related to the field of neuromorphic computing. More specifically, embodiments of the disclosure relate to systems and methods for overshoot compensation.

BACKGROUND

Traditional central processing units ("CPUs") process instructions based on "clocked time." Specifically, CPUs operate such that information is transmitted at regular time intervals. Based on complementary metal-oxide-semiconductor ("CMOS") technology, silicon-based chips may be manufactured with more than 5 billion transistors per die with features as small as 10 nm. Advances in CMOS technology have been parlayed into advances in parallel computing, which is used ubiquitously in cell phones and personal computers containing multiple processors.

However, as machine learning is becoming commonplace for numerous applications including bioinformatics, computer vision, video games, marketing, medical diagnostics, online search engines, etc., traditional CPUs are often not able to supply a sufficient amount of processing capability while keeping power consumption low. In particular, machine learning is a subsection of computer science directed to software having the ability to learn from and make predictions on data. Furthermore, one branch of machine learning includes deep learning, which is directed at utilizing deep (multilayer) neural networks.

Currently, research is being done to develop direct hardware implementations of deep neural networks, which may include systems that attempt to simulate "silicon" neurons (e.g., "neuromorphic computing"). Neuromorphic chips (e.g., silicon computing chips designed for neuromorphic computing) operate by processing instructions in parallel (e.g., in contrast to traditional sequential computers) using bursts of electric current transmitted at non-uniform intervals. As a result, neuromorphic chips require far less power to process information, specifically, artificial intelligence ("AI") algorithms. To accomplish this, neuromorphic chips may contain as much as five times as many transistors as a traditional processor while consuming up to 2000 times less power. Thus, the development of neuromorphic chips is directed to provide a chip with vast processing capabilities that consumes far less power than conventional processors. Further, neuromorphic chips are designed to support dynamic learning in the context of complex and unstructured data.

Disclosed herein are systems and methods for pulse-width modulated multipliers.

SUMMARY

Disclosed herein is a neuromorphic integrated circuit, including in many embodiments, a neural network disposed in a multiplier array in a memory sector of the integrated circuit, and a plurality of multipliers of the multiplier array, a multiplier thereof including at least one transistor-based cell configured to store a synaptic weight of the neural network, an input configured to accept digital input pulses for the multiplier, an output configured to provide digital output pulses of the multiplier, and a charge integrator, where the charge integrator is configured to integrate a current associated with an input pulse of the input pulses over an input pulse width thereof, and where the multiplier is configured to provide an output pulse of the output pulses with an output pulse width proportional to the input pulse width.

In a further embodiment, inputs for the input pulses of the plurality of multipliers and outputs for the output pulses of the plurality of multipliers provide the neural network with digital routing between layers of the neural network.

In another embodiment, the transistor-based cell includes two transistors.

In a still further embodiment, the two transistors include one positive transistor and one negative transistor.

In still another embodiment, the power consumption of either the positive transistor or negative transistor is approximately zero in response to a digital input value of approximately zero.

In a yet further embodiment, the power consumption of either the positive transistor or negative transistor is approximately zero in response to a synaptic weight value of approximately zero.

In a further embodiment again, the multiplier is also configured to provide an output pulse in response to an input integrated voltage and an input ramping voltage.

In a further additional embodiment, the multiplier is a two-quadrant multiplier.

In another additional embodiment, the two-quadrant multiplier includes a positive voltage input and a negative voltage input that can be utilized for erasure by setting the transistor-based cell to an extreme synaptic weight value by programming of the positive and negative input voltages.

In a still yet further embodiment, overshoot can be compensated for in the two-quadrant multiplier by re-programming the positive input voltage with an increased synaptic weight value in response to a synaptic weight value in the negative voltage input greater than the initially programmed synaptic weight value.

In a still yet another embodiment, the charge integrator outputs a voltage based on the multiplication of the input pulse width associated with the signal timing, and a current that is associated with the synaptic weight value.

In still yet another embodiment, the integrated circuit is configured to operate on battery power.

A further embodiment includes methods of integrating with an integrator a current associated with a digital input pulse of a plurality of digital input pulses over an input pulse width of the input pulse, and providing with a multiplier a digital output pulse of a plurality of digital output pulses having an output pulse width proportional to the input pulse width, where the multiplier is one of a plurality of multipliers of a multiplier array in a memory sector of a neuromorphic integrated circuit, and where the multiplier includes at least one transistor-based cell configured to store a synaptic weight of a plurality of synaptic weights of a neural network disposed in the multiplier array, an input configured to accept the input pulses for the multiplier, an output configured to provide the output pulses of the multiplier, and the charge integrator.

Additional embodiments include digitally routing between layers of the neural network, where inputs for the input pulses of the plurality of multipliers and outputs for the output pulses of the plurality of multipliers provide the neural network with digital routing between the layers of the neural network.

Further embodiments include a transistor-based cell that includes two transistors.

Still further embodiments include the two transistors of the transistor-based cell composed of one positive transistor and one negative transistor.

Additional embodiments include the power consumption of either the positive transistor or negative transistor being approximately zero in response to a digital input current value of approximately zero.

Yet additional embodiments include the power consumption of either the positive transistor or negative transistor being approximately zero in response to a synaptic weight value of approximately zero.

Yet further embodiments include the multiplier being composed of a two-quadrant multiplier.

Additional further embodiments include the two-quadrant multiplier composed of a positive voltage input and a negative voltage input that can be utilized for erasure by setting the transistor-based cell to an extreme synaptic weight value by programming of the positive and negative input voltages.

DRAWINGS

Embodiments of this disclosure are illustrated by way of example and not by way of limitation in the figures of the accompanying drawings, in which like references indicate similar elements and in which:

FIG. 1 provides a schematic illustrating a system 100 for designing and updating neuromorphic integrated circuits ("ICs") in accordance with some embodiments.

Figure 2:
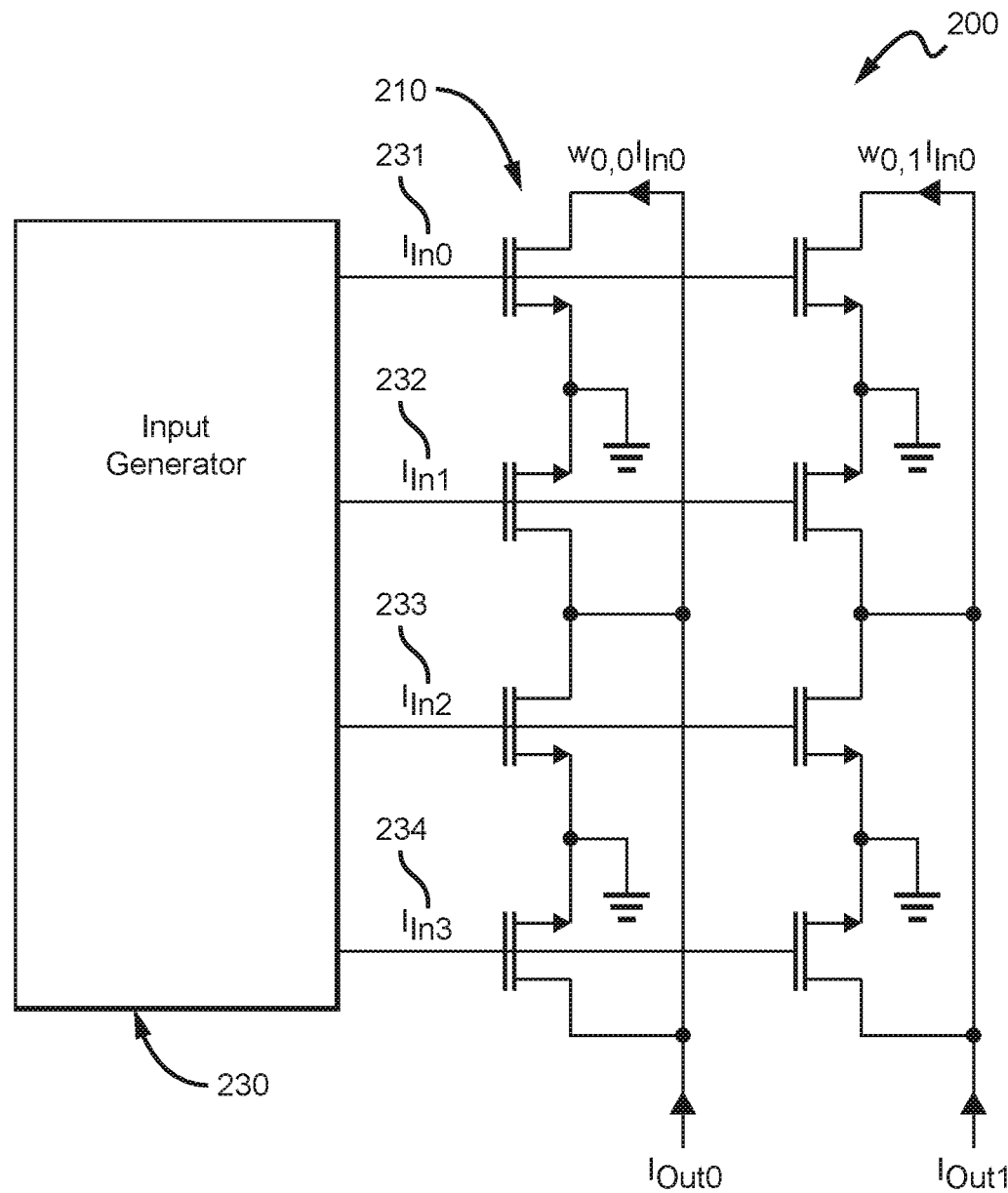

FIG. 2 provides a schematic illustrating an analog multiplier array in accordance with some embodiments.

Figure 3:
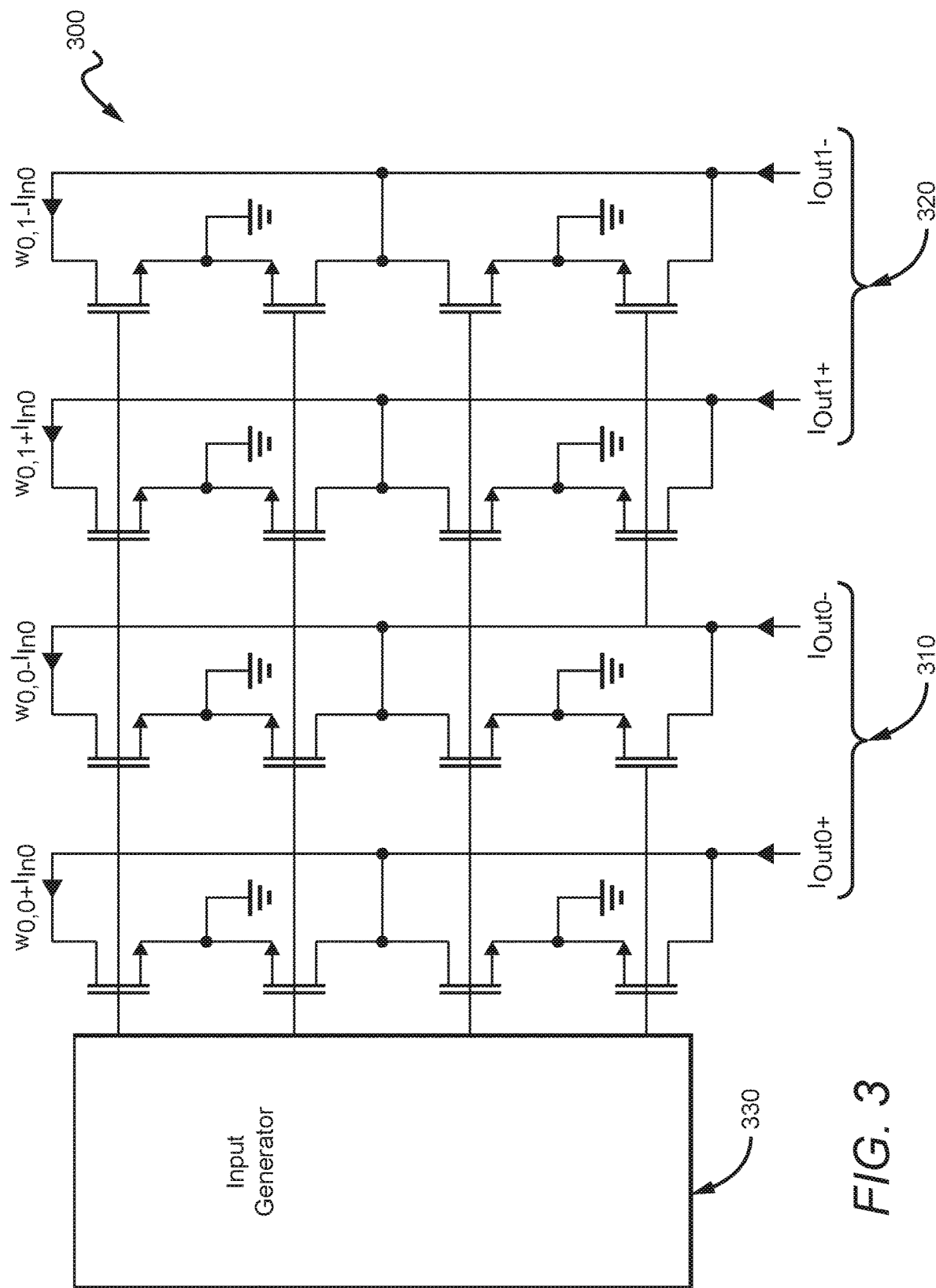

FIG. 3 provides a schematic illustrating an analog multiplier array in accordance with some embodiments.

Figure 4:
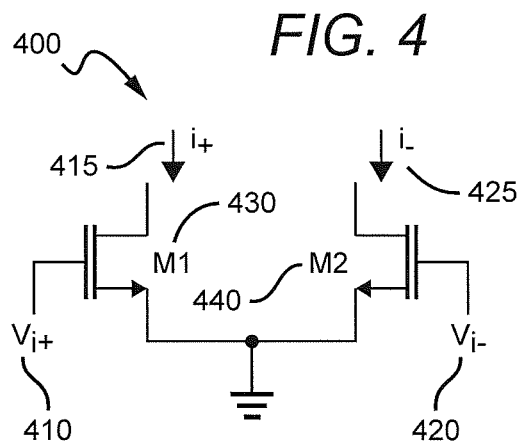

FIG. 4 provides a schematic illustrating a bias-free, two-quadrant multiplier of an analog multiplier array in accordance with some embodiments.

Figure 5:
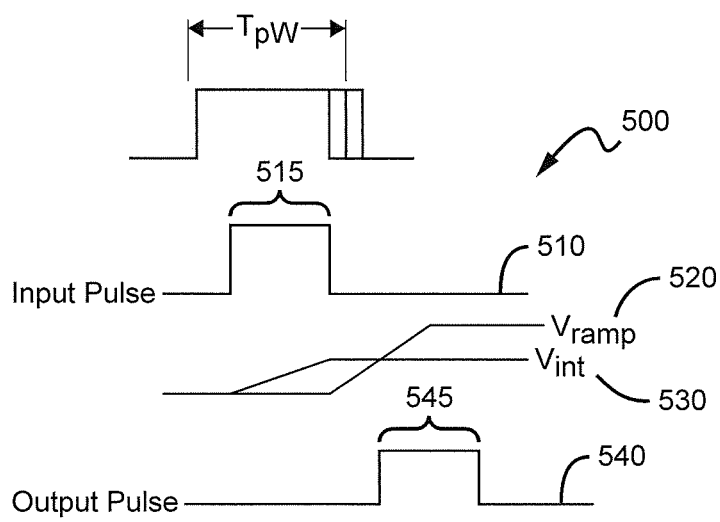

FIG. 5 provides a schematic illustrating conversion of an input pulse having an input pulse width into an output pulse having an output pulse width in accordance with some embodiments.

Figure 6:
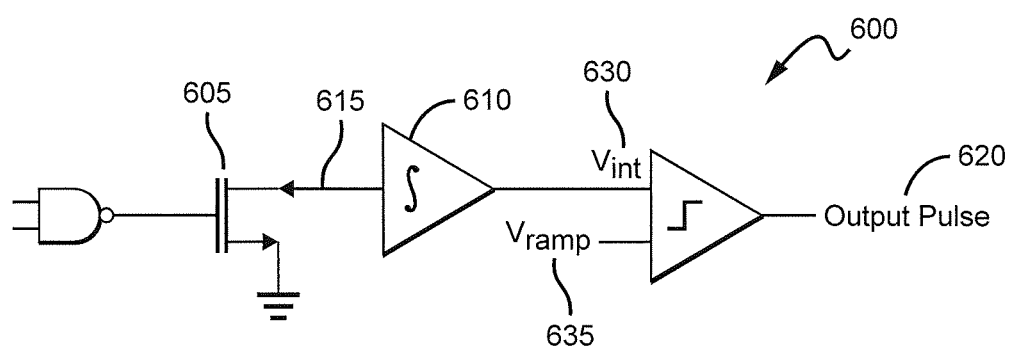

FIG. 6 provides a schematic illustrating a charge integrator of a multiplier for converting an input pulse into an output pulse in accordance with some embodiments.

DESCRIPTION

Terminology

In the following description, certain terminology is used to describe features of the invention. For example, in certain situations, the tetra "logic" may be representative of hardware, firmware and/or software that is configured to perform one or more functions. As hardware, logic may include circuitry having data processing or storage functionality. Examples of such circuitry may include, but are not limited or restricted to a microprocessor, one or more processor cores, a programmable gate array, a microcontroller, a controller, an application specific integrated circuit, wireless receiver, transmitter and/or transceiver circuitry, semiconductor memory, or combinatorial logic.

The term "process" may include an instance of a computer program (e.g., a collection of instructions, also referred to herein as an application). In one embodiment, the process may be included of one or more threads executing concurrently (e.g., each thread may be executing the same or a different instruction concurrently).

The term "processing" may include executing a binary or script, or launching an application in which an object is processed, wherein launching should be interpreted as placing the application in an open state and, in some implementations, performing simulations of actions typical of human interactions with the application.

The term "object" generally refers to a collection of data, whether in transit (e.g., over a network) or at rest (e.g., stored), often having a logical structure or organization that enables it to be categorized or typed. Herein, the terms "binary file" and "binary" will be used interchangeably.

The term "file" is used in a broad sense to refer to a set or collection of data, information or other content used with a computer program. A file may be accessed, opened, stored, manipulated or otherwise processed as a single entity, object or unit. A file may contain other files, and may contain related or unrelated contents or no contents at all. A file may also have a logical format, or be part of a file system having a logical structure or organization of plural files. Files may have a name, sometimes called simply the "filename," and often appended properties or other metadata. There are many types of files, such as data files, text files, program files, and directory files. A file may be generated by a user of a computing device or generated by the computing device. Access and/or operations on a file may be mediated by one or more applications and/or the operating system of a computing device. A filesystem may organize the files of the computing device of a storage device. The filesystem may enable tracking of files and enable access of those files. A filesystem may also enable operations on a file. In some embodiments the operations on the file may include file creation, file modification, file opening, file reading, file writing, file closing, and file deletion.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Referring now to FIG. 1, a schematic illustrating a system 100 for designing and updating neuromorphic ICs is provided in accordance with some embodiments. As shown, the system 100 can include a simulator 110, a neuromorphic synthesizer 120, and a cloud 130 configured for designing and updating neuromorphic ICs such as neuromorphic IC 102. As further shown, designing and updating neuromorphic ICs can include creating a machine learning architecture with the simulator 110 based on a particular problem. As those skilled in the art can appreciate, cloud-based computer system may include, but are not limited to systems that can provide software as a service ("SaaS"), platform as a service ("PaaS"), and or infrastructure as a service ("IaaS") resources. The neuromorphic synthesizer 120 can subsequently transform the machine learning architecture into a netlist directed to the electronic components of the neuromorphic IC 102 and the nodes to which the electronic components are connected. In addition, the neuromorphic synthesizer 120 can transform the machine learning architecture into a graphic database system ("GDS") file detailing the IC layout for the neuromorphic IC 102. From the netlist and the GDS file for the neuromorphic IC 102, the neuromorphic IC 102, itself, can be fabricated in accordance with current IC fabrication technology. Once the neuromorphic IC 102 is fabricated, it can be deployed to work on the particular problem for which it was designed. While the initially fabricated neuromorphic IC 102 can include an initial firmware with custom synaptic weights between the nodes, the initial firmware can be updated as needed by the cloud 130 to adjust the weights. Being as the cloud 130 is configured to update the firmware of the neuromorphic IC 102, the cloud 130 is not needed for everyday use.

Neuromorphic ICs such as the neuromorphic IC 102 can be up to 100× or more energy efficient than graphics processing unit ("GPU") solutions and up to 280× or more energy efficient than digital CMOS solutions with accuracies meeting or exceeding comparable software solutions. This makes such neuromorphic ICs suitable for battery powered applications.

Neuromorphic ICs such as the neuromorphic IC 102 can be configured for application specific standard products ("ASSP") including, but not limited to, keyword spotting, speaker identification, one or more audio filters, gesture recognition, image recognition, video object classification and segmentation, or autonomous vehicles including drones. For example, if the particular problem is one of keyword spotting, the simulator 110 can create a machine learning architecture with respect to one or more aspects of keyword spotting. The neuromorphic synthesizer 120 can subsequently transform the machine learning architecture into a netlist and a GDS file corresponding to a neuromorphic IC for keyword spotting, which can be fabricated in accordance with current IC fabrication technology. Once the neuromorphic IC for keyword spotting is fabricated, it can be deployed to work on keyword spotting in, for example, a system or device.

Neuromorphic ICs such as the neuromorphic IC 102 can be deployed in toys, sensors, wearables, augmented reality ("AR") systems or devices, mobile systems or devices, appliances, Internet of things ("IoT") devices, or hearables.

Referring now to FIG. 2, a schematic illustrating an analog multiplier array 200 is provided in accordance with some embodiments. Such an analog multiplier array can be based on a digital NOR flash array in that a core of the analog multiplier array can be similar to a core of the digital NOR flash array or the same as a core of the digital NOR flash array. That said, at least select and read-out circuitry of the analog multiplier array are different than a digital NOR array. For example, output current is routed as an analog signal to a next layer rather than over bit lines going to a sense-amp/comparator to be converted to a bit. Word-line analogs are driven by analog input signals rather than a digital address decoder. Furthermore, the analog multiplier array 200 can be used in neuromorphic ICs such as the neuromorphic IC 102.

Since the analog multiplier array 200 is an analog circuit, input and output current values (or signal values) can vary in a continuous range instead of simply on or off. This is useful for storing weights (aka coefficients) of a neural network as opposed to digital bits. In operation of certain embodiments, the weights are multiplied in a core by input current values 231, 232, 233, 234 to provide output current values that are combined to arrive at a decision of the neural network. In many embodiments, the input current values 231, 232, 233, 234 are provided by an input generator 230. Those skilled in the art will recognize that such input current values can be generated or obtained from a variety of devices or other components within the system. Furthermore, stored charge within a multiplier 210 can shift voltage on the floating gate and scales drain current by weight $w_{i,j}$.

As those skilled in the art can appreciate, the analog multiplier array 200 can utilize standard programming and erase circuitry to generate tunneling and erase voltages.

Referring now to FIG. 3, a schematic illustrating an analog multiplier array 300 is provided in accordance with some embodiments. The analog multiplier array 300 can use two transistors (e.g., a positive transistor and a negative transistor) such as, but not limited to a metal-oxide semiconductor field effect transistor ("MOSFET") or field-effect transistor ("FET") to perform a two-quadrant multiplication of a signed weight (e.g., a positive weight or a negative weight) and a non-negative input current value. In many embodiments, the input current values can be provided by a separate input generator 330. The input generation of 330 can be similar to that of the input generator depicted in FIG. 2 in certain embodiments. If an input current value provided by the input generator 330 is multiplied by a positive or negative weight, the product or output current value can respectively be either positive or negative. A positively weighted product can be stored in a first column (e.g., column corresponding to $I_{Out0+}$ in the analog multiplier array 300), and a negatively weighted product can be stored in a second column (e.g., column corresponding to $I_{Out0-}$ in the analog multiplier array 300). By way of example and not limitation, $I_{Out0+}$ and $I_{Out0-}$ can be taken as a differential current output 310 that then is provided to a plurality of current-sensing circuitry including, but not limited to, current mirrors, charge integrators, and/or transimpedance amplifiers. The foregoing differential outputs 310, 320 can provide positively and negatively weighted products or output signal values can be taken as a differential current value to provide useful information for making a decision.

Because each output current from the positive or negative transistor is wired to ground and proportional to the product of the input current value and the positive or negative weight, respectively, the power consumption of the positive or negative transistor is near zero when the input current values or weights are at or near zero. That is, if the input signal values are '0,' or if the weights are '0,' then no power will be consumed by the corresponding transistors of the analog multiplier array 300. This is significant because in many neural networks, often a large fraction of the values or the weights are '0,' especially after training. Therefore, energy is saved when there is nothing to do or going on. This is unlike differential pair-based multipliers, which consume a constant current (e.g., by means of a tail bias current) regardless of the input signal.

Referring now to FIG. 4, a schematic illustrating a bias-free, two-quadrant multiplier 400 of an analog multiplier array such as the analog multiplier array 300 is provided in accordance with some embodiments. As previously set forth, because each output current from the positive transistor (e.g., positive output current M1 415 of the two-quadrant multiplier 400) or negative transistor (e.g., negative output current M2 425 of the two-quadrant multiplier 400) is proportional to the product of the input current value and the positive or negative weight, respectively, the power consumption of the positive transistor 430 or negative transistor 440 is near zero when the input current values or weights are near zero. This is unlike differential pair-based multipliers, which consume a constant current (e.g., by means of a tail bias current) regardless of the input signal.

When programming a two-quadrant multiplier such as the bias-free, two-quadrant multiplier 400, it is common to erase each programmable cell (e.g., the cell including positive transistor M1 430 and the cell including negative transistor M2 440) thereof to set the cells to one extreme weight value before setting each of the cells to its target weight value. Extending this to a full array such as the analog multiplier array 300, all of the programmable cells in the full array are set to one extreme weight value before setting each of the cells to its target weight value. When setting the cells to their desired weight values, a problem of overshoot exists if one or more of the cells is set with a higher weight value than targeted. As a result, many or all of the cells in the full array must then be reset to the one extreme weight value before resetting the cells to their target weight values. However, the differential structure of each of the bias-free, two-quadrant multipliers of the analog multiplier arrays provided herein allows for compensating such overshoot by programming, thereby obviating the time-consuming process of erasing and resetting all of the cells in an array.

In an example of compensating for overshoot by programming, a negative voltage input $v_{i-}$ 0 410 and positive voltage input $v_{i+}$ 420 of the two-quadrant multiplier 400 can be utilized for erasure to set the cells to one extreme weight value. After erasing the cells, if negative voltage input $v_{i-}$ 410 is programmed with too large a weight value, positive voltage input $v_{i+}$ 420 can be programmed with a larger weight value than initially targeted to compensate for the weight value of negative voltage input $v_{i-}$ 410 and achieve the initially targeted effect. Therefore, the differential structure can be exploited to compensate for programming overshoot without having to erase any one or more cells and start over.

FIG. 5 provides a schematic 500 illustrating conversion of an input pulse 510 having an input pulse width 515 into an output pulse 540 having an output pulse width 545 in accordance with some embodiments.

As shown, a digital input pulse 510 having an input pulse width 515 can be converted into a digital output pulse 540 having an output pulse width 545 proportional to the input pulse width 515. To effect the foregoing, a charge integrator in that may be located within a multiplier can be configured to integrate a current associated with the input pulse 510 to produce an output or integrated voltage $V_{int}$ 530. The integrated voltage $V_{int}$ 530 can be subsequently compared to a ramp voltage $V_{ramp}$ 520 and converted into the output pulse 540, which output pulse can have the output pulse width 545 proportional to the input pulse width 515. Neuromorphic ICs such as the neuromorphic IC 102 can utilize such pulse-width modulation to control electrical power in the neuromorphic ICs.

FIG. 6 provides a schematic 600 illustrating a charge integrator 610 of a multiplier for use in converting an input pulse into an output pulse 620 in accordance with some embodiments.

As shown, a charge integrator 610 for an output of a multiplier can be configured to integrate a current associated with a digital input pulse having an input pulse width to produce an output or integrated voltage $V_{int}$ 630. In many embodiments, the integrated voltage can be produced when stored charge from a transistor 605 shifts voltage on the floating gate and sets on-state drain current 615 proportional to weight $w_{i,j}$. In many embodiments, the charge integrator 610 produces an output voltage which is a product of time (associated with the input pulse width such as the input pulse width depicted in FIG. 5.) and current (which is associated with a weight). The integrated voltage $V_{int}$ 630 can be subsequently compared to a ramp voltage $V_{ramp}$ 635 and converted into an output pulse 620 having a proportional output pulse width.

For example, a neuromorphic ICs such as the neuromorphic IC 102 can include a neural network disposed in a multiplier array in a memory sector of the IC as set forth herein. A multiplier of the multiplier array can include at least one transistor-based cell (e.g., the cell including a transistor M1, the cell including a transistor M2, etc.); however, two-quadrant multipliers are generally described herein. The multiplier can further include an input to the cell, an output from the cell, and a charge integrator. The transistor of the cell can be configured to store a synaptic weight of the neural network via a stored charge in a transistor similar to FIG. 6. The input to the cell can be configured to accept digital input pulses for the multiplier. The output from the cell can be configured to provide digital output pulses of the multiplier. The charge integrator can be configured to integrate a current associated with an input pulse of the input pulses over an input pulse width thereof. The multiplier can be configured to provide an output pulse of the output pulses with an output pulse width proportional to the input pulse width. Such inputs for the input pulses of the plurality of multipliers and outputs for the output pulses of the plurality of multipliers provide the neural network with digital routing between layers of the neural network.

The core multiplying FET of the foregoing neuromorphic IC can be configured to operate in triode or strong inversion for reduced output current noise compared to weak inversion saturation.

Methods of such neuromorphic ICs can include integrating with a charge integrator a current associated with a digital input pulse over an input pulse width of the input pulse; and providing with a multiplier a digital output pulse having an output pulse width proportional to the input pulse width. Again, the multiplier can be a multiplier as set forth herein. Methods can further include digitally routing between layers of the neural network. Inputs for input pulses of a plurality of multipliers and outputs for output pulses of the plurality of multipliers can provide the neural network with digital routing between the layers of the neural network.

Again, neuromorphic ICs such as the neuromorphic IC 102 can use such pulse-width modulation as set forth herein to control electrical power in the neuromorphic ICs.

The foregoing methods enable faster weight value programming because multiple time-consuming erasing and reprogramming steps are obviated. This applies to both global and single-cell erasures. It is noted that while single-cell erasures can be effected in some related technologies, such related technologies use larger, non-standard cells. Such larger, non-standard cells are not as dense or as economical. And, again, such multiple single-cell erasures are time-consuming compared to methods provided herein.

In the foregoing description, the invention is described with reference to specific exemplary embodiments thereof. It will, however, be evident that various modifications and changes may be made thereto without departing from the broader spirit and scope of the invention as set forth in the appended claims.

What is claimed is:
1. A neuromorphic integrated circuit, comprising:
   a neural network disposed in a multiplier array in a memory sector of the integrated circuit; and
   a plurality of multipliers of the multiplier array, a multiplier thereof including at least:
      a transistor-based cell comprising at least a positive transistor and a negative transistor, configured to store a synaptic weight of the neural network;

an input configured to accept digital input pulses for the multiplier;

an output configured to provide digital output pulses of the multiplier; and a charge integrator, wherein the charge integrator is configured to integrate a current associated with an input pulse of the input pulses over an input pulse width thereof;

wherein the power consumption of either the positive transistor or negative transistor is approximately zero in response to a digital input value of approximately zero; and wherein the multiplier is configured to provide an output pulse of the output pulses with an output pulse width proportional to the input pulse width.

2. The neuromorphic integrated circuit of claim 1, wherein inputs for the input pulses of the plurality of multipliers and outputs for the output pulses of the plurality of multipliers provide the neural network with digital routing between layers of the neural network.

3. The integrated circuit of claim 1, wherein the power consumption of either the positive transistor or negative transistor is approximately zero in response to a synaptic weight value of approximately zero.

4. The integrated circuit of claim 1, wherein the multiplier is further configured to provide an output pulse in response to an input integrated voltage and an input ramping voltage.

5. The integrated circuit of claim 1, wherein the multiplier is a two-quadrant multiplier.

6. The integrated circuit of claim 5, wherein the two-quadrant multiplier comprises a positive voltage input and a negative voltage input that can be utilized for erasure by setting the transistor-based cell to an extreme synaptic weight value by programming of the positive and negative input voltages.

7. The integrated circuit of claim 6, wherein overshoot can be compensated for in the two-quadrant multiplier by re-programming the positive input voltage with an increased synaptic weight value in response to a synaptic weight value in the negative voltage input greater than the initially programmed synaptic weight value.

8. The integrated circuit of claim 1, wherein the charge integrator outputs a voltage based on the multiplication of the input pulse width associated with the signal timing, and a current that is associated with the synaptic weight value.

9. The integrated circuit of either claim 1 or 2, wherein the integrated circuit is configured to operate on battery power.

10. A method, comprising:

integrating with an integrator a current associated with a digital input pulse of a plurality of digital input pulses over an input pulse width of the input pulse; and providing with a multiplier a digital output pulse of a plurality of digital output pulses having an output pulse width proportional to the input pulse width, wherein the multiplier is one of a plurality of multipliers of a multiplier array in a memory sector of a neuromorphic integrated circuit, and wherein the multiplier includes at least:

a transistor-based cell comprising at least one positive transistor and one negative transistor, the transistor-based cell configured to store a synaptic weight of a plurality of synaptic weights of a neural network disposed in the multiplier array;

an input configured to accept the input pulses for the multiplier;

an output configured to provide the output pulses of the multiplier; and the charge integrator; and wherein the power consumption of either the positive transistor or negative transistor is approximately zero in response to a digital input current value of approximately zero.

11. The method of claim 10, further comprising:

digitally routing between layers of the neural network, wherein inputs for the input pulses of the plurality of multipliers and outputs for the output pulses of the plurality of multipliers provide the neural network with digital routing between the layers of the neural network.

12. The method of claim 11, wherein the power consumption of either the positive transistor or negative transistor is approximately zero in response to a synaptic weight value of approximately zero.

13. The method of claim 10, wherein the multiplier is a two-quadrant multiplier.

14. The method of claim 13, wherein the two-quadrant multiplier comprises a positive voltage input and a negative voltage input that can be utilized for erasure by setting the transistor-based cell to an extreme synaptic weight value by programming of the positive and negative input voltages.

* * * * *